US011205496B2

(12) United States Patent
Chang et al.

(10) Patent No.: US 11,205,496 B2
(45) Date of Patent: Dec. 21, 2021

(54) APPARATUS AND METHOD FOR TESTING STORAGE DEVICE IN POWER INTERRUPTIONS

(71) Applicants: GOKE TAIWAN RESEARCH LABORATORY LTD., Taipei (TW); XINSHENG INTELLIGENT TECHNOLOGY CO., LTD., Jiangsu (CN)

(72) Inventors: Po-Chien Chang, Taipei (TW); Ru-Yi Yang, Zhudong Township (TW); Po-Wen Hsieh, Zhubei (TW)

(73) Assignees: GOKE TAIWAN RESEARCH LABORATORY LTD., Taipei (TW); XINSHENG INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 17/012,368

(22) Filed: Sep. 4, 2020

(65) Prior Publication Data
US 2020/0402604 A1      Dec. 24, 2020

Related U.S. Application Data

(62) Division of application No. 16/294,187, filed on Mar. 6, 2019, now abandoned.

(51) Int. Cl.
*G11C 29/12*   (2006.01)
*G11C 29/38*   (2006.01)
(Continued)

(52) U.S. Cl.
CPC ........ *G11C 29/12* (2013.01); *G11C 29/12005* (2013.01); *G11C 29/38* (2013.01); *G06F 1/30* (2013.01); *G06F 11/261* (2013.01)

(58) Field of Classification Search
None
See application file for complete search history.

(56) References Cited

U.S. PATENT DOCUMENTS 5,353,240 A  * 10/1994 Mallory ................ G06F 11/273
                                                  324/73.1
6,704,827 B1 *  3/2004 Smith .................. G06F 11/261
                                                  379/21

(Continued)

OTHER PUBLICATIONS

Q. Hasan, Y. Ise, S. Okada and P. Lijun, "Nonvolatile Memory Pre-Silicon Power Loss Test Using FPGA," 2018 14th IEEE International Conference on Solid-State and Integrated Circuit Technology (ICSICT), 2018, pp. 1-3, doi: 10.1109/ICSICT.2018.8565817.*

(Continued)

*Primary Examiner* — Steve N Nguyen
(74) *Attorney, Agent, or Firm* — Karin L. Williams; Alan D. Kamrath; Mayer & Williams PC

(57) ABSTRACT

A programmable testing apparatus imposes power interruptions on a storage device at any given point of time under at least one workload according to at least one protocol for tests. The programmable testing apparatus includes a controller unit connected to a workload unit, a power control unit, a protocol control unit and a data buffer unit. The controller unit calculates and receives and replies commands in the tests. The workload unit imposes various workloads on the storage device. The power control unit imposes power interruptions on the storage device under control of the controller unit. The protocol control unit provides commands according to the protocol for tests. The data buffer unit stores critical data and information to check whether data stored in the storage device are correct.

8 Claims, 3 Drawing Sheets

(51) Int. Cl.
*G06F 11/26* (2006.01)
*G06F 1/30* (2006.01)

(56) References Cited

U.S. PATENT DOCUMENTS

| | | | |
|---|---|---|---|
| 7,873,885 B1* | 1/2011 | Shin | G11C 29/08 |
| | | | 714/724 |
| 10,678,667 B1* | 6/2020 | Majerus | G06F 11/27 |
| 2006/0179332 A1* | 8/2006 | Ether | G06F 1/30 |
| | | | 713/320 |
| 2019/0018814 A1 | 1/2019 | Ma et al. | |

OTHER PUBLICATIONS

H. Tseng, L. Grupp and S. Swanson, "Understanding the impact of power loss on flash memory," 2011 48th ACM/EDAC/IEEE Design Automation Conference (DAC), New York, NY, 2011, pp. 35-40.

* cited by examiner

APPARATUS AND METHOD FOR TESTING STORAGE DEVICE IN POWER INTERRUPTIONS

CROSS REFERENCE

The present application is a division of U.S. patent application Ser. No. 16/294,187 filed on Mar. 6, 2019.

BACKGROUND OF INVENTION

Field of Invention

The present invention relates to an apparatus and method for testing storage device in power interruptions and, more particularly, to a programmable apparatus and method for testing storage device in power interruptions.

Related Prior Art

When used as a storage device, a typical solid-state disk ("SSD") includes a port such as a SATA, SAS and fiber channel for connection to a computer port via a bus. However, the SATA is designed for a hard disk drive ("HDD"), and gets less and less useful for SSDs that get faster and faster. Hence, the performance of some SSDs is limited by the performance of the SATA.

A non-volatile memory express ("NVMe") is a logic device port protocol that is an excellent, high-performance and expansible host controller interface. The primary concept of the NVMe is provision of a transmission loop of a direct processor via a peripheral component interconnect express ("PCIe"). Advantageously, the access to the NVMe exhibits low latency and high frequency. Moreover, the NVMe is advantageous in power consumption management for providing automatic power consumption state switch and dynamic energy consumption management.

A storage device has to undergo tests for endurance under a workload such as sequential access, random access, and access to large or small files. Storage device for consumers undergo a different degree of tests from storage device for enterprises. For the tests, there are various regulations such as JESD 218 and JESD 219. The tests are intended to ensure that each storage device exhibits proper durability and quality.

Conventionally, a storage device is tested under a workload in many rounds and/or for a long period of time. Requirements and environments for tests are set forth in the regulations. Regarding the durability and reliability, a storage device is tested according to experience or for a long period of time. Conventional firmware of a storage device might be able to cope with normal loss of power. However, the firmware could easily ignore power interruptions and jeopardize the retention of a user's data, an essential performance of the storage device. If a power interruption occurs and the firmware ignores it, the user's data could disappear, the system could crash, the firmware of the storage device could fail to access to the user's data, or initialization of the storage device could fail in the first place.

Conventionally, an operation system executes an application software program to test a storage device, power interruptions are executed in a regular manner. Hence, flexibility and complexity of a testing routine are limited. In addition, the power interruptions are done in a regular manner, and this is not satisfactory. Alternatively, a person imposes power interruptions on the storage device randomly. However, the person cannot execute power interruptions precisely at given points in the execution of a command or routine under various workloads. Hence, it is difficult to thoroughly locate problems with the firmware related to power interruptions. Moreover, in every round, conventional testing equipment tests the storage device in only one manner such as a command/routine test, an initialization test and a pressure test, not allowing a testing person to change the manners for testing any time he or she likes.

The present invention is therefore intended to obviate or at least alleviate the problems encountered in prior art.

SUMMARY OF INVENTION

It is an objective of the present invention to provide an apparatus for testing a storage device in power interruptions by simulating various power interruptions in programmable manner so that flaws of firmware of the storage device can be detected effectively and efficiently and that stability and reliability of the storage device are improved.

It is another objective of the present invention to provide an apparatus for testing a storage device in power interruptions by simulating power interruptions in given commands or routines without having to wait for replies from the given commands or routines, thereby rendering tests effective.

It is another objective of the present invention to provide an apparatus for testing a storage device in power interruptions by simulating various combinations of different types of power interruptions.

To achieve the foregoing objectives, the programmable testing apparatus imposes power interruptions on a storage device at any given point of time under at least one workload according to at least one protocol for tests. The programmable testing apparatus includes a controller unit connected to a workload unit, a power control unit, a protocol control unit and a data buffer unit. The controller unit calculates and receives and replies commands in the tests. The workload unit imposes various workloads on the storage device. The power control unit imposes power interruptions on the storage device under control of the controller unit. The protocol control unit provides commands according to the protocol for tests. The data buffer unit stores critical data and information to check whether data stored in the storage device are correct.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1:
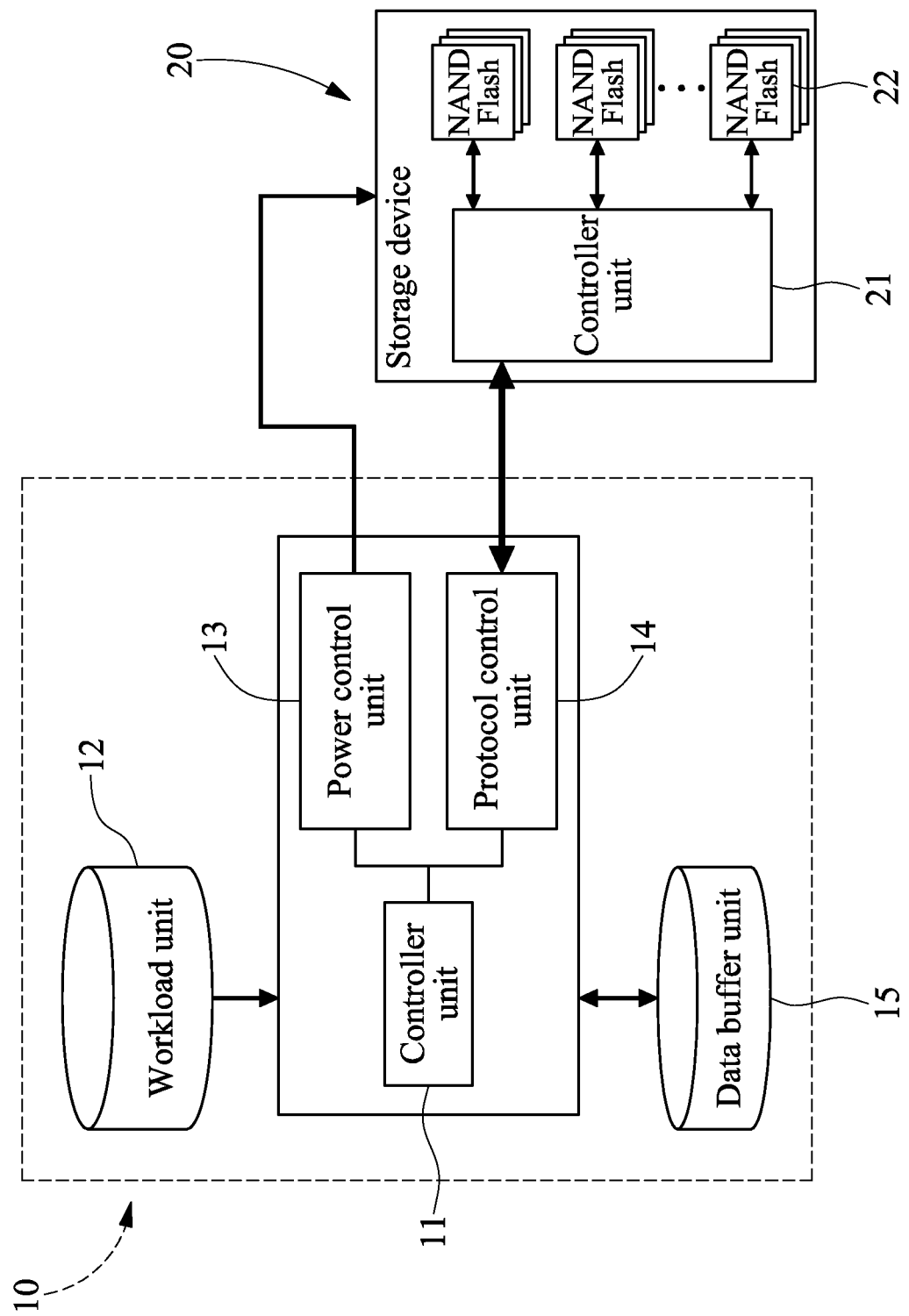
FIG. 1 is a block diagram of an apparatus for testing storage device in power interruptions according to the preferred embodiment of the present invention.

Referring to FIG. 1, a programmable apparatus 10 for testing storage device 20 in power interruptions according to the preferred embodiment of the present invention. The storage device 20 is preferably an NVMe solid-state drive that includes multiple NAND flash memories 22 controlled by a controller unit 21. The programmable testing apparatus 10 is operable to impose power interruptions on the storage device 20 and then check the storage device 20. The programmable testing apparatus 10 imposes power interruptions on the storage device 20 under various workloads including but not limited to continuous access, random access and access to large or small files. Thus, problems with firmware and algorithms run in the storage device 20 can be found and then solved quickly. Hence, the stability and reliability of the storage device 20 are improved.

The programmable testing apparatus 10 includes a controller unit 11, a workload unit 12, a power control unit 13, a protocol control unit 14, and a data buffer unit 15. The programmable testing apparatus 10 is connected to the storage device 20 selectively via the power control unit 13 or the protocol control unit 14.

The controller unit 11 is used to receive and transmit commands in the tests to complete execution of commands including but not limited to changing the types of power interruptions, the total number of tests, cycles (or "sequences") of the tests and calculation of results of the tests.

The workload unit 12 is connected to the controller unit 11 so that the controller unit 11 can instruct the workload unit 12 to impose various workloads on the storage device 20. The workload unit 12 is used to describe a ratio of actions over commands executed by the storage device 20 on a user's site according to JDEC 218 and 219 for example. The workloads include continuous access, random access and access to large or small files. The contexts of the workloads are determined according to product positioning of the storage device 20 such as word-processing, game-playing or email-handling. The workload unit 12 is intended to simulate actions taken in the storage device 20 on the user's site.

The power control unit 13 is connected to the controller unit 11. The power control unit 13 can be selectively connected to the storage device 20. Thus, the controller unit 11 can instruct the power control unit 13 to turn on and off the storage device 20.

The protocol control unit 14 is also connected to the controller unit 11. The protocol control unit 14 can be selectively connected to the storage device 20. Thus, the controller unit 11 can instruct the protocol control unit 14 to send corresponding test protocols such as those related to a command/routine test mode, an initialization test mode and a pressure test mode. The protocol control unit 14 is intended to check, compare and determine whether the storage device 20 succeed or fail in the tests.

The data buffer unit 15 is also connected to the controller unit 11. The data buffer unit 15 is used to record critical data and information to facilitate the protocol control unit 14 to check where the data stored in the storage device 20 is correct. The critical data recorded in the data buffer unit 15 include lengths and addresses of N entries of data stored in the storage device 20 before power interruption and other data areas that cannot be overwritten.

Figure 2:
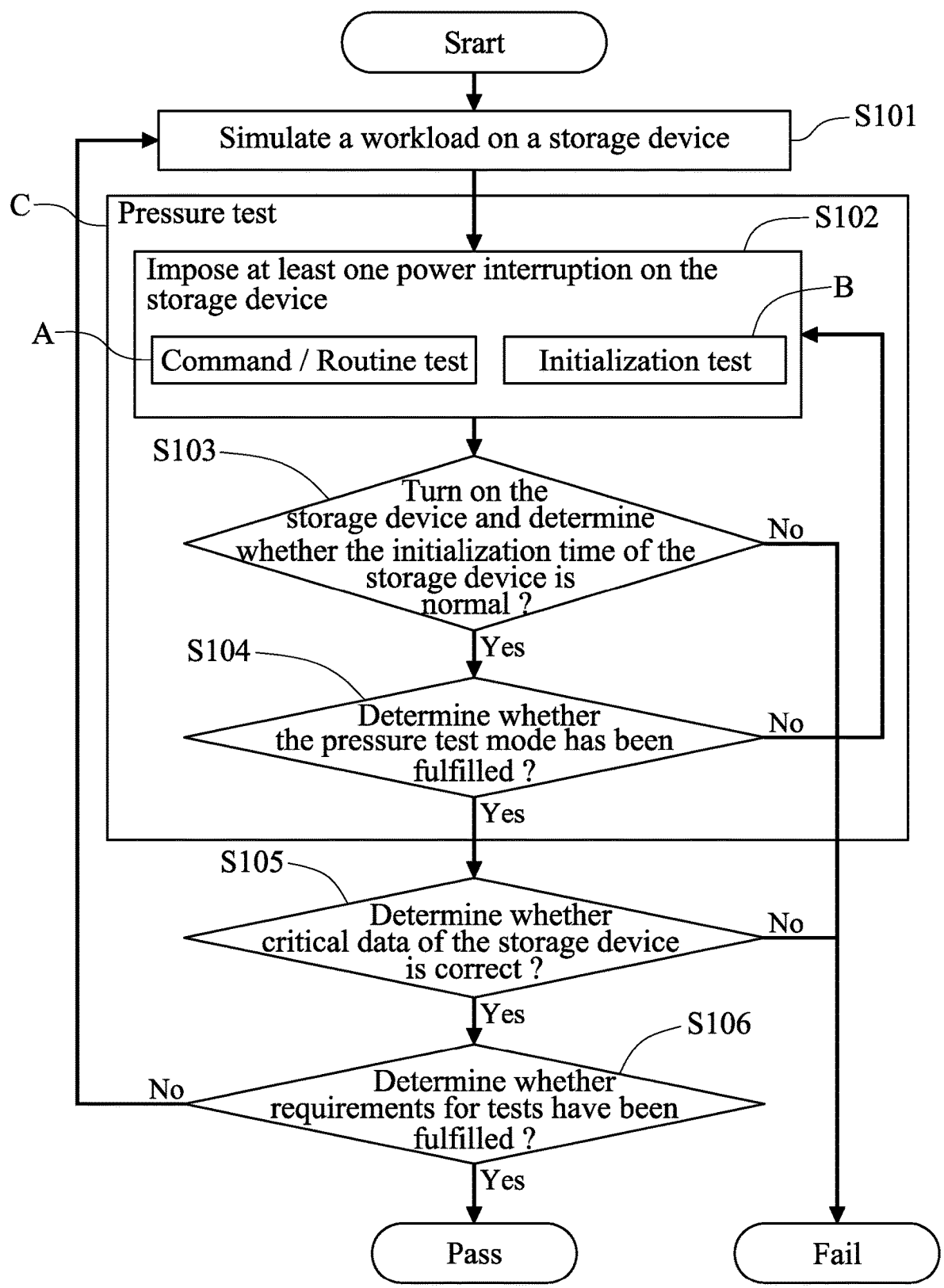
FIG. 2 is a flow chart of a method for testing storage device in power interruptions, using the apparatus shown in FIG. 1.
Figure 3:
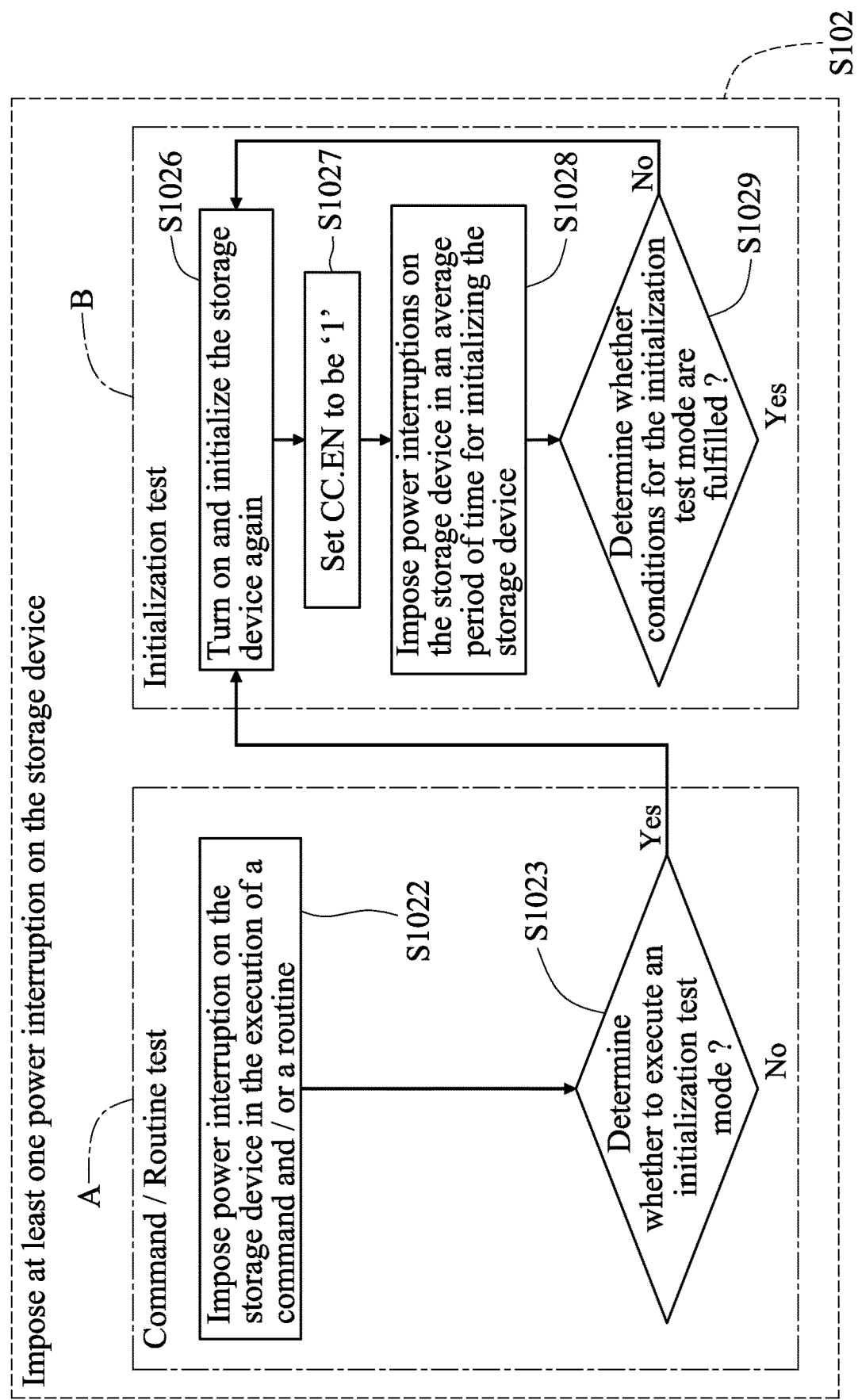
FIG. 3 is a flow chart of a portion of the method shown in FIG. 2.

As mentioned above, the programmable testing apparatus 10 is used to test the storage device 20 according to JDEC 218 and 219 for example. The programmable testing apparatus 10 executes a testing method shown in FIGS. 2 and 3.

At S101, the storage device 20 is operated to execute at least one simulated workload. Based on settings in the workload unit 12, the controller unit 11 actuates the storage device 20 to execute at least one simulated workload such as continuous access, random access and access to large or small files.

Then, at S102, at least one power interruption is imposed on the storage device 20 according to a setting. In practice, the power control unit 13 of the programmable testing apparatus 10 imposes power interruptions on the storage device 20 under the simulated workload at various points of time. The protocol control unit 14 is operable to set the modes of the power interruptions imposed on the storage device 20. As mentioned above, the modes include but not limited to a command/routine test mode represented by 'A', an initialization test mode represented by 'B' and a pressure test mode represented by 'C.'

In the command/routine test mode, power interruptions are imposed on the storage device 20 in the execution of a command and/or a routine. A routine includes multiple commands. Two steps represented by 'S1022' and 'S1023' are taken in the command/routine test mode.

In the initialization test mode, the storage device 20 is turned on and initialized again after it is turned off, and power interruptions are imposed on the storage device 20 in the initialization. Four steps represented by 'S1026', 'S1027', 'S1028' and 'S1029' are taken in the initialization test mode.

At S1022, power interruptions are imposed on the storage device 20 in the execution of a command and/or a routine.

At S1023, it is determined whether to execute the initialization test mode. The process goes to S1026 if the initialization test mode is to be executed and goes to S103 if otherwise.

At S1026, the storage device 20 is turned on and initialized again after it is turned off.

Then, at S1027, CC.EN is set to be '1' According to NVMe, the programmable testing apparatus 10 repeatedly reads CSTS.RDY of data temporarily stored in the storage device 20 until CSTS.RDY is turned into "1" from "0" when CC.EN is "1." In the transition of CSTS.RDY, the data storage device 20 must obey a Timeout value of the controller unit 21. The storage device 20 is ready for work and the programmable testing apparatus 10 can execute further commands on the storage device 2 when CSTS.RDY is "1."

Then, at S1028, power interruptions are imposed on the storage device 20 in an average period for initializing the storage device 20. In the transition of CSTS.RDY, the firmware might be handling an uncompleted task such as GC, WL and POR, or accessing to or moving data in the flash memory 22. Hence, addition of programmable parameters and power interruptions could very likely expose flaws (or "bugs") of the firmware.

Then, at S1029, it is determined whether conditions for the initialization test mode are fulfilled. The storage device 20 determines whether all conditions of designated tests have been fulfilled. The process goes to S103 if all conditions of designated tests have been fulfilled and returns to S1026 if otherwise.

Various combinations of the command/routine test mode with the initialization test mode can be programed. The pressure test mode can be any combination of the command/routine test mode with the initialization test mode. In the pressure test mode, the command/routine test mode is executed for multiple times and/or the initialization test mode is executed for multiple times. Preferably, the command/routine test mode is executed for a large number of times, and so is the initialization test mode.

Then, at S103, the storage device 20 is turned on again, and it is determined whether a period for initializing the storage device 20 is normal. The power control unit 13 turns on the storage device 20 again after turning off the storage device 20 at the given point of time. The protocol control unit 14 determines whether the time spent on initializing the data storage device 20 for the re-operation is normal. The process goes to S104 if the period for initializing the storage device 20 is normal. Otherwise, the storage device 20 is determined to fail.

Then, at S104, it is determined whether the pressure test mode has been fulfilled. The controller unit 11 determines whether a programmed combination of the command/routine test mode with the initialization test mode is fulfilled. The process goes to S105 if the programmed combination of the command/routine test mode with the initialization test mode is fulfilled, and returns to S102 (S1022 or S1026 in specific) if otherwise.

Then, at S105, it is determined whether critical data of the storage device 20 is correct. The controller unit 11 uses the data buffer unit 15 to determine whether the critical data in the storage device 20 are correct. The critical data include but not limited to the length and addresses of N entries of data written in the storage device 20 before the storage device 20 is turned off and other data areas that cannot be overwritten. The process goes to S105 if the critical data is correct, and the storage device 20 is determined to fail if otherwise.

At S106, it is determined whether requirements for tests have been fulfilled. In detail, it is determined whether required methods for tests, required cycles (or "sequences") of tests and a required number of each of the required cycles of tests have been fulfilled. The process returns to S101 if the requirements for tests have not been fulfilled. The storage device 20 is determined to pass the tests and the process ends if the requirements for tests have not been fulfilled.

After a power interruption, it must be checked whether the initialization of CSTS.RDY of the storage device 20 according to NVMe is completed in Timeout regulated by NVMe. Very likely, something has gone wrong with the firmware of the storage device 20 in the power interruption if the storage device 20 fails the test. Damages of the firmware of the storage device 20 caused by power interruptions must be examined and repaired.

The apparatus and method of the present invention for testing the storage device 20 according to NVMe exhibits several advantageous features.

Firstly, the command/routine test mode is executed in a programmable manner. Thus, a power interruption can be done at any given point of time in the execution of any given command. Hence, the locations of the flaws of the firmware of the storage device 20 can be detected more precisely in the present invention than in the prior art.

Secondly, the initialization test mode is executed in a programmable manner. Thus, various actions can be taken according to NVMe in the tests, and a power interruption can be done in any given action according to NVMe.

Thirdly, the pressure test mode is executed in a programmable manner. Thus, the pressure test mode can be any desired combination of the command/routine test mode with the initialization test mode. Hence, the present invention can find more flaws of the firmware of the storage device 20 and faster than the prior art.

As mentioned above, the locations of the flaws of the firmware of the storage device 20 can be detected precisely, and the flaws of the firmware of the storage device 20 can be detected thoroughly. Hence, the flaws of the firmware of the storage device can be detected and repaired effectively, and the storage device 20 can be stable and reliable after the tests and repair.

The present invention has been described via the illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A testing method for imposing power interruptions on a storage device at any given point of time under at least one workload according to at least one protocol for tests, the programmable testing apparatus comprising the steps of:
  imposing at least one simulated workload on the storage device;
  imposing a cycle of at least one power interruption on the storage device;
  turning off the storage device;
  turning on the storage device again;
  determining whether a period for initializing the storage device is normal;
  determining the storage device to fail if the period for initializing the storage device is not normal;
  determining whether the cycle has been completed if the period for initializing the storage device is normal;
  returning to the step of imposing a cycle of at least one power interruption on the storage device if the cycle has not been completed;
  determining whether critical data of the storage device are correct if the cycle has been completed;
  determining the storage device to fail if the critical data of the storage device are not normal;
  determining whether the storage device has fulfilled conditions for tests;
  returning to the step of imposing at least one simulated workload on the storage device if the storage device has not fulfilled conditions for tests; and
  ending if the storage device has fulfilled the conditions for tests.

2. The method according to claim 1, wherein the cycle comprises at least one power interruption in execution of a command.

3. The method according to claim 1, wherein the cycle comprises at least one power interruption in execution of a routine comprising multiple commands.

4. The method according to claim 1, wherein the cycle comprises at least one power interruption in initialization of the storage device.

5. The method according to claim 1, wherein the cycle comprises multiple power interruptions in execution of commands and multiple power interruptions in execution of routines each of which comprises multiple commands.

6. The method according to claim 1, wherein the cycle comprises multiple power interruptions in execution of commands, multiple power interruptions in execution of routines each of which comprises multiple commands, and multiple power interruptions in initialization of the storage device.

7. The method according to claim 6, wherein the step of imposing a cycle of at least one power interruption on the storage device comprises the step of determining whether to impose a power interruption in initialization of the storage device after imposing power interruptions in execution of commands and routines.

8. The method according to claim 1, wherein the storage device is an NVMe storage device.

\* \* \* \* \*